(12) United States Patent
Yoder

(10) Patent No.: US 10,834,833 B1
(45) Date of Patent: Nov. 10, 2020

(54) SEALED ECU MODULE HOUSING WITH COMB SUPPORT

(71) Applicant: VEONEER US INC., Southfield, MI (US)

(72) Inventor: Jacob Jay Yoder, Dundee, MI (US)

(73) Assignee: VEONEER US INC., Southfield, MI (US)

( * ) Notice: Subject to any disclaimer, the term of this patent is extended or adjusted under 35 U.S.C. 154(b) by 0 days.

(21) Appl. No.: 16/718,735

(22) Filed: Dec. 18, 2019

(51) Int. Cl.
*H05K 5/00* (2006.01)
*H01R 43/20* (2006.01)

(52) U.S. Cl.
CPC .......... *H05K 5/0047* (2013.01); *H01R 43/205* (2013.01); *H05K 5/0069* (2013.01)

(58) Field of Classification Search
CPC ... H05K 5/0047; H05K 5/0069; H01R 43/205
See application file for complete search history.

(56) References Cited

U.S. PATENT DOCUMENTS

| | | | | |
|---|---|---|---|---|
| 6,962,499 B2* | 11/2005 | Yamamoto | ......... | H01R 13/4361 439/541.5 |
| 9,277,658 B2* | 3/2016 | Tanaka | ................. | H05K 5/0069 |
| 9,756,741 B2* | 9/2017 | Blossfeld | .............. | H01R 13/41 |
| 10,455,712 B1* | 10/2019 | Malecke | .............. | H01R 13/415 |
| 10,729,021 B1* | 7/2020 | Sanchez | .............. | H01R 43/005 |

* cited by examiner

*Primary Examiner* — Ross N Gushi
(74) *Attorney, Agent, or Firm* — Christopher P. Maiorana, PC

(57) ABSTRACT

A method of assembling an electronic control unit comprises assembling a terminal carrier holding a plurality of terminal pins into a housing using translational motions, inserting at least one comb tool through one or more connector openings until a plurality of beams of the comb tool are placed between the terminal carrier, a comb support feature, and a shoulder on an end of each of a plurality of terminal pins, and assembling a printed circuit board substrate to the plurality of terminal pins by inserting the end of each of the plurality of terminal pins into the printed circuit board substrate using a press fit.

16 Claims, 14 Drawing Sheets

SEALED ECU MODULE HOUSING WITH COMB SUPPORT

FIELD OF THE INVENTION

The invention relates to automotive control assemblies generally and, more particularly, to a method and/or apparatus for implementing a sealed electronic control unit (ECU) module housing with comb support.

BACKGROUND

In manufacturing electronic control modules, it is difficult and/or expensive to produce a sealed module containing right angle connectors due to multiple interfaces requiring sealing. Manufacturers commonly specify sealing levels for fully assembled electronic modules. One or more connectors are typically included on the electronic modules to make electrical connections between printed circuit boards within the modules and vehicle harnesses outside the modules. In some applications, the automotive industry often requires an electronic control module be sealed to the environment. Thus, the control module connector needs to eliminate potential leak paths.

International Electrotechnical Commission (IEC) standard 60529, "Degrees of Protection Provided by Enclosures (IP Codes)," Ed. 2.2 (Geneva: International Electrotechnical Commission, 2013), classifies the degrees of protection provided against the intrusion of solid objects (including body parts like hands and fingers), dust, accidental contact, and water in electrical enclosures. The standard aims to provide users more detailed information than vague marketing terms such as waterproof. The automotive industry requirements vary from sealing a module from a light water spray (e.g., IP 53) to complete immersion to a depth of 1 meter for 30 minutes (e.g., IP 67/68). In some applications, sealing to pressures up to 6 psi (e.g., IP 68) is required. In some cases the pressure differential is created due to an application requirement to preheat the module to 85° C. prior to conducting the water spray or immersion testing.

Possible leak paths between the connectors and electronic module housings are commonly sealed with dispensed seals or gaskets, or the use of potting or bonding components outside the housings to fill gaps. The conventional design approaches are expensive and have other shortcomings.

It would be desirable to implement a sealed electronic control unit (ECU) module housing with comb support.

SUMMARY

The invention concerns a method of assembling an electronic control unit comprising assembling a terminal carrier holding a plurality of terminal pins into a housing using translational motions, inserting a comb tool through one or more connector openings of the housing until a first side of a plurality of beams of the comb tool are in contact with a plurality of ribs of a comb support feature and a second side of the plurality of beams of the comb tool are in contact with a shoulder of each of the plurality of terminal pins, and assembling a printed circuit board substrate to the plurality of terminal pins by inserting the end of each of the plurality of terminal pins into the printed circuit board substrate using a press fit. The housing generally comprises four sides and the comb support feature generally extends perpendicularly from a fifth side. The sides of the housing generally define a rectilinear volume. Each of the plurality of terminal pins comprises a right angle bend. The comb support feature generally comprises a plurality of slots into which the right angle bend of the terminal pins may fit during a first translational motion placing the terminal carrier and the plurality of terminal pins into the housing. A first end of the plurality of terminal pins is generally inserted into the one or more connector openings in one of the four sides of the housing during a second translational motion, and the terminal carrier interlocks with the housing to hold the terminal carrier and the plurality of terminal pins in place. The terminal carrier, the comb support feature, the shoulders on the end of each of the plurality of terminal pins, and the comb tool generally support the plurality of terminal pins to prevent a force of the press fit from bending the plurality of terminal pins.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include a method and/or an apparatus providing a sealed electronic control unit (ECU) module housing with comb support that may (i) limit sealing to only one interface, (ii) be cost effective to manufacture, (iii) eliminate a potential leak path between the connector shrouds and housing by integrating the connector geometry into the housing, (iv) provide a method of assembling terminal pins to a circuit substrate (e.g., a printed circuit board (PCB) substrate) that is robust and accommodating to different pin sizes and spacing, (v) improve overall quality by allowing a metal comb to be used to support a press fit force when inserting the terminal pins into the circuit substrate, and/or (vi) provide better control over pin location and insertion depth.

An electronic control module (ECM) enclosure typically contains some type of housing and one or more connectors. One difficulty in designing an integral connector housing is to be able to support a press fit force associated with assembling a circuit substrate (e.g., a printed circuit board (PCB) substrate) to terminal pins already installed within the housing. By designing a housing with the features of the invention, a terminal carrier may be assembled to the housing prior to the PCB being assembled to the terminal pins in the terminal carrier. The separate assembly generally allows a press fit force to be supported by a tool rather than the terminals and/or the housing. The housing design in accordance with an embodiment of the invention may decrease cost by removing labor and/or expensive insert molding from a supplier. The terminal carrier may be fastened to the housing by various methods including, but not limited to, guide features, snap fits, screws, and/or some type of welding. The circuit substrate may be attached to the terminal pins in the terminal carrier subsequent to the terminal carrier being inserted into the housing. In various embodiments, terminal alignment plates may also be used to ensure true positioning of the terminal pins.

Figure 1:
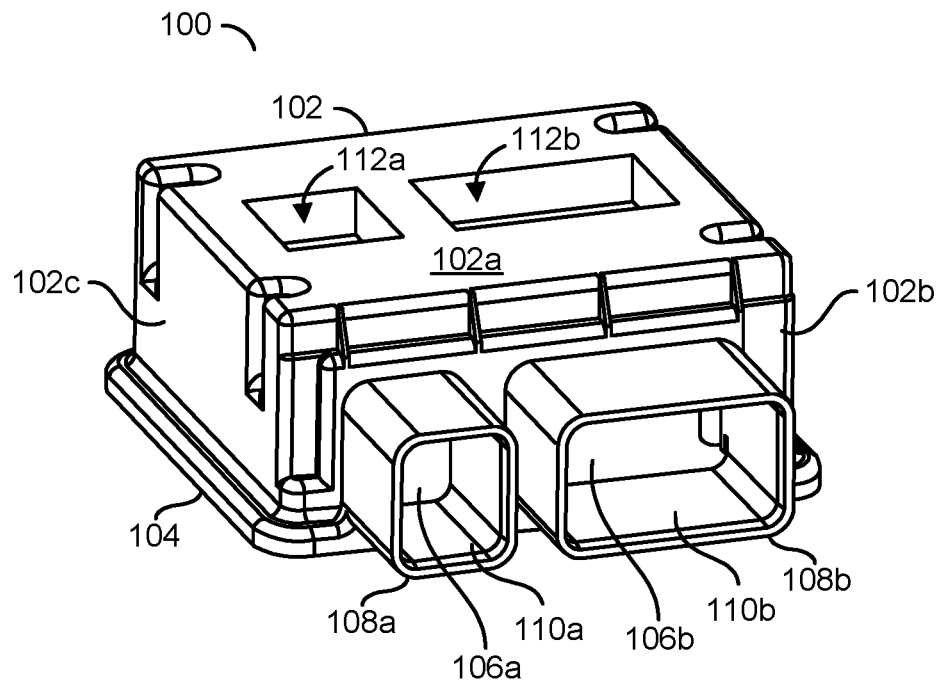
FIG. 1 is a diagram illustrating a perspective view of an upper portion of a housing of an apparatus in accordance with an example embodiment of the invention.

Referring to FIG. 1, a diagram is shown illustrating a housing 100 in accordance with an example embodiment of the invention. In various embodiments, the housing (or enclosure) 100 may be part of an electronic control unit (or module). In an example, the electronic control unit (ECU) may be configured for application in a motor vehicle. In various embodiments, the housing (or enclosure) 100 comprises an upper housing 102 and a lower housing (or cover or baseplate) 104 (not visible). While mated with the lower housing 104, the upper housing 102 may be configured to provide an environmentally sealed enclosure. The enclosure 100 may protect components and devices of a subassembly enclosed within.

In various embodiments, the upper housing 102 may be implemented as a non-conductive enclosure. In various embodiments, the upper housing 102 generally comprises a plastic or resin based material. In various embodiments, the plastic material may include, but is not limited to, polyamide (NYLON), polybutylene terephthalate (PBT), polypropylene, polyethylene terephthalate (PET), acrylonitrile butadiene styrene (ABS), and/or various alloys and/or fillers of these resins. Other materials may be implemented to meet the design criteria of a particular application.

In various embodiments, the upper housing 102 generally includes five sides 102a-102e. In an example, the side 102a may be referred to as a top of the upper housing 102 and the sides 102b-102e may extend approximately perpendicularly from the side 102a. The terms upper and top are used for convenience of description and not as an indication a particular orientation of the electronic control module housing 100 is required. In various embodiments, one of the sides (e.g., 102b) of the upper housing 102 may include two connector openings 106a and 106b. The two connector openings 106a and 106b may be surrounded by respective connector shrouds 108a and 108b that may be integrated into the upper housing 102. However, other numbers (e.g., 1-n) of connector openings (e.g., 106a-106n) and connector shrouds (e.g., 108a-108n) may be implemented to meet design criteria of a particular implementation. The connector shrouds 108a and 108b are generally integrated into the upper housing 102. In an example, the upper housing 102 and the connector shrouds 108a and 108b may be molded (made) as a single (unitary) piece. Molding or otherwise incorporating the connector shrouds as part of the upper housing (enclosure) generally eliminates a need for sealing the connector/housing interface(s).

In various embodiments, the housing 100 generally includes an integral connector sealing feature to reduce or eliminate potential leak paths. In an example, inner surfaces 110a and 110b of the connector shrouds 108a and 108b, respectively, may be configured to seal the connector shrouds 108a and 108b to mating connectors (not shown) so the connector openings within the connector shrouds 108a and 108b do not present a potential leakage path into an interior of the housing 100. In an example, the mating connectors (not shown) may comprise an O-ring or some other type of gasket or seal configured to seal against the inner surfaces 110a and 110b of the connector shrouds 108a and 108b.

In some embodiments, the upper housing 102 may further comprise two indentations 112a and 112b. The indentations 112a and 112b in a surface (e.g., 102a) perpendicular to surface comprising the two connector openings 106a and 106b. The indentation 112a and 112b are generally positioned to correspond (align) with the connector openings 106a and 106b and the connector shrouds 108a and 108b. The indentation 112a and 112b are generally configured to allow a tool (or tools) to be inserted to provide back support for a comb support feature (not visible) within the upper housing 102. In an example, the indentation 112a and 112b generally reduce an amount of material (and, therefore, weight) in the upper housing 102, while still facilitating use of a tool to provide support to the comb support feature within the upper housing 102.

In an example, the lower housing (or cover or baseplate) 104 may be implemented as a die-cast aluminum baseplate. In another example, the lower housing (or cover or baseplate) 104 may be implemented as a stamped steel baseplate. Implementing the lower housing 104 with a metallic material may aid in dissipating heat generated by circuitry within the sealed enclosure 100. In various embodiments, the lower housing 104 may be machined to create a sealing surface against which a gasket placed between the upper housing 102 and the lower housing 104 may form a seal when the upper housing 102 and the lower housing 104 are fastened together.

In some embodiments, the lower housing 104 may be configured to provide a mounting footprint for the electronic control module housing 100. In an example, the lower housing 104 may be implemented with an RCM8 mounting footprint to simplify testing. However, other footprints may be implemented to meet the design criteria of a particular application. In an example, the housing 100 may be implemented similarly to a housing described in co-pending U.S. Non-provisional application Ser. No. 15/925,665, which is incorporated by reference in its entirety.

In an example, the connector shroud 108a may be configured to accept a 52-pin connector and the connector shroud 108b may be configured to accept a 104-pin connector. The 52 and 104 pin connectors may be configured to provide electrical connections to a circuit board enclosed within the enclosure 100. In an example, the connectors may be implemented as 1.8 mm pitch Nano connectors. However, other types and sizes of connectors may be implemented to meet the design criteria of a particular implementation.

Figure 2:
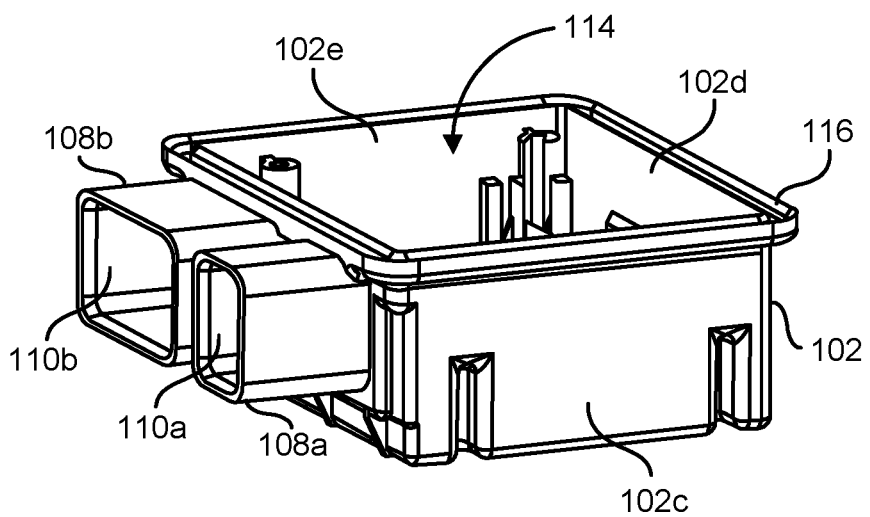
FIG. 2 is a diagram illustrating an opening in the upper portion of the housing in accordance with an example embodiment of the invention.

Referring to FIG. 2, a diagram is shown illustrating an opening in the upper housing 102 facilitating an assembly process in accordance with an example embodiment of the invention. The five sides 102a-102e of the upper housing 102 generally define an interior space (e.g., rectilinear volume) within the housing 100. The five sides 102a-102e generally leave an opening 114 through which a pre-assembled terminal pin assembly and a printed circuit board substrate may be inserted during respective manufacturing steps. In an example, the pre-assembled terminal pin assembly is generally inserted (lowered) into the upper housing 102 followed by a translational motion to slide a first end of the terminal pins of the terminal pin assembly into the connector openings 106a and 106b. The comb support feature within the upper housing 102 is generally configured to allow the terminal pin assembly to be inserted into the upper housing 102 while still providing a support surface for use with a comb tool to support a press fit force on the terminal pins during insertion of the terminal pins into plated holes (or vias) of the printed circuit board substrate. The opening 114 into the upper housing 102 is generally closed by assembly of the lower housing 104 to the upper housing 102. In various embodiments, assembly of the lower housing 104 to the upper housing 102 may be accomplished via screws, snaps, heat staking, etc. In various embodiments, the upper housing 102 may include geometry (e.g., groove, etc.) 116 to accommodate a gasket, a dispensed type sealant, an adhesive sealant, or welded cover to seal the interface between the upper housing 102 and the lower housing 104.

Figure 3:
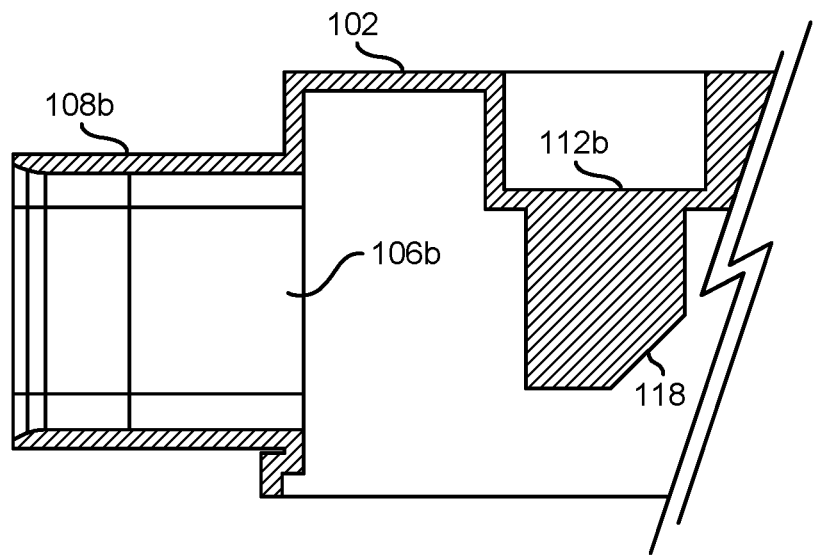
FIG. 3 is a diagram of a cross-sectional view illustrating an integral comb support feature of the housing in accordance with an example embodiment of the invention.

Referring to FIG. 3, a diagram of a cross-sectional view is shown illustrating an integral comb support feature within the housing 100 in accordance with an example embodiment of the invention. In various embodiments, an integral comb support feature 118 may be incorporated into the upper housing 102. The integral comb support feature (or features) 118 is generally located below the indentations 112a and 112b. In an example, separate comb support features 118 may be associated with each of the indentation 112a and 112b. In another example, the indentation 112a and 112b may be aligned with a single comb support feature 118. The integral comb support feature 118 is generally integrated into the upper housing 102. In an example, the upper housing 102 and the integral comb support feature 118 may be molded (made) as a single (unitary) piece.

In an example, the integral comb support feature 118 is generally configured to allow a pre-assembled terminal pin assembly to be inserted (e.g., lifted or lowered) into the upper housing 102 followed by a translational motion to slide the first end of the terminal pin of the terminal pin assembly into the connector openings 106a and 106b. The comb support feature 118 within the upper housing 102 is generally configured to allow the terminal pin assembly to be inserted into the upper housing 102 while still providing a support surface for use with a comb tool to support a press fit force on a second end of the terminal pins of the terminal pin assembly during insertion of the terminal pins into plated holes (or vias) of a printed circuit board substrate. Facilitating the use of the comb tool is advantageous because typical plastics are not strong enough to reliably support the terminal pins under the press-fit load from the insertion into the circuit board press-fit holes.

Figure 4:
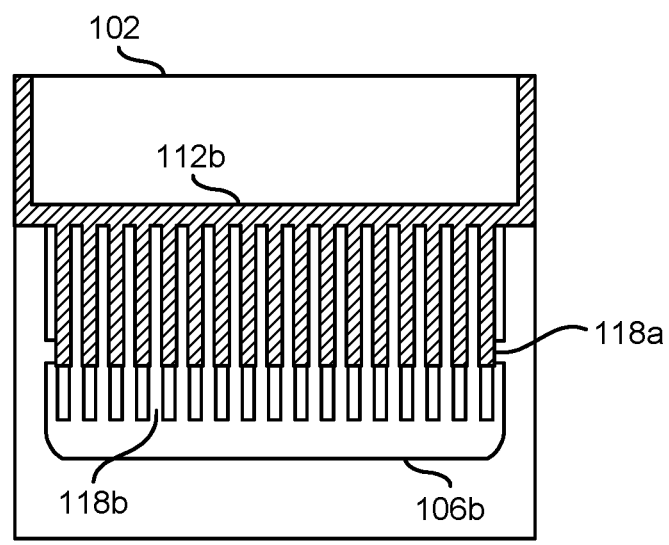
FIG. 4 is a diagram of another cross-sectional view illustrating slots in the integral comb support feature of the housing in accordance with an example embodiment of the invention.

Referring to FIG. 4, a diagram of another cross-sectional view is shown illustrating a number of slots in the integral comb support feature 118 in accordance with an example embodiment of the invention. In an example, the comb support feature 118 comprises a number of ribs 118a and a number of slots 118b. The ribs 118a are generally configured to provide a distributed support surface that may be used to support a comb tool inserted through the connector openings 106a and 106b. The slots 118b are generally configured to admit individual terminal pins of the terminal pin assembly as the terminal pin assembly is inserted into the upper housing 102. The slots 118b are generally further configured to allow (guide) rows of the individual terminal pins of the terminal pin assembly to move toward the connector openings 106a and 106b without any interference. In an example, the slots 118b may be sized slightly larger that a diameter (or thickness) of the terminals pins to maximize an area of the distributed support surface while allowing the terminal pin assembly to be inserted easily into the upper housing 102 despite slight variation(s) in terminal pin spacing.

Figure 5:
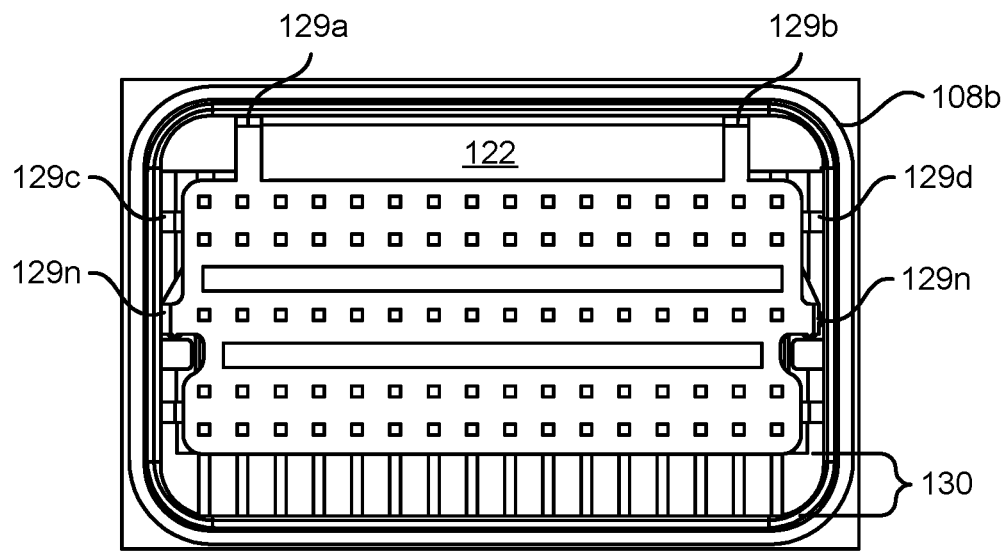
FIG. 5 is a diagram of a terminal pin assembly in accordance with an example embodiment of the invention.
Figure 5:
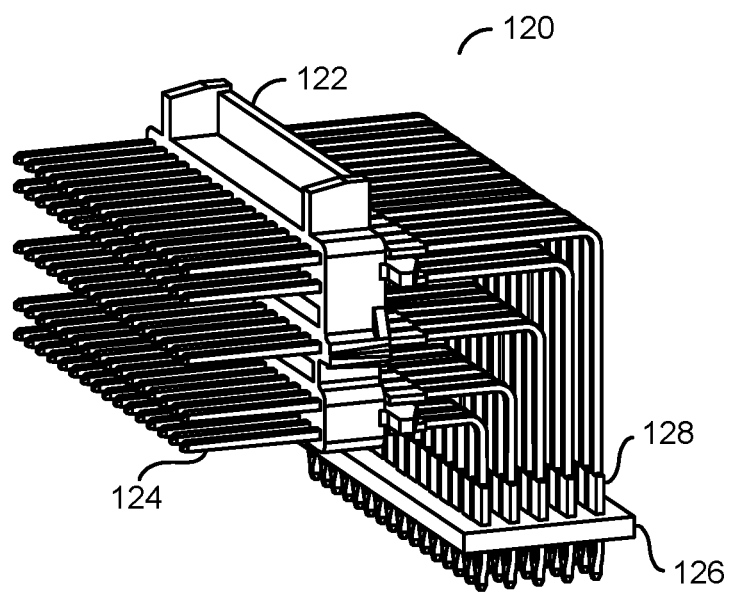

Referring to FIG. 5, a diagram is shown illustrating a terminal pin assembly in accordance with an example embodiment of the invention. In various embodiments, a terminal pin assembly 120 may comprise a terminal carrier (or header or keeper) 122 and a plurality of terminal pins 124. The terminal carrier 122 is generally used to maintain a dimensional relationship between the terminal pins 124. The terminal carrier 122 also supports the terminal pins 124 within the connector shrouds 108a and 108b. In an example, the terminal pins 124 may be stitched into the terminal carrier 122, which retains and controls the position of the terminal pins 124. After the terminal pins 124 are stitched into the terminal carrier 122, the terminal pins 124 may be bent to a right angle.

In various embodiments, the terminal carrier 122 may be configured to fit through a respective connector opening 106a or 106b and within a respective connector shroud 108a and 108b. In an example, the terminal carrier 122 may comprise a number of locating features 129a-129n for vertical and horizontal alignment. In an example, the locating features 129a-129n may comprise alignment or datum ribs and crush ribs. In an example, alignment or datum ribs may be implemented on one side of the terminal carrier 122 and crush ribs may be implemented on the opposite side of the terminal carrier 122 to create a press-fit (or interlock) into the respective connector shrouds 108*a* and 108*b*.

In some embodiments, the terminal carrier 122 may also comprise tabs or a flange that stops on an inside surface of the housing 102 to control a maximum insertion distance. In an example, the terminal carrier 122 may also be constrained to the connector shrouds 108*a* and 108*b* by snap features, heat or cold staking, any type of welding, use of adhesive, or screws. In various embodiments, the terminal carrier 122 is smaller in height than the inside of the connector openings 106*a* and 106*b* and the connector shrouds 108*a* and 108*b* to leave a gap 130 for a manufacturing purpose (described below in connection with FIG. 6).

In some embodiments, the terminal pin assembly 120 may also comprise a pin alignment plate (or alignment film) 126 at a circuit board end of the terminal pins 124. The pin alignment plate 126 is generally assembled to the terminals pins 124 abutting a shoulder 128 of each terminal pin 124. An end of each terminal pin 124 generally extends past the pin alignment plate 126 for insertion into a printed circuit board substrate 132 (not shown). In an example, the circuit board ends of the terminal pins 124 may be configured for being press fit (e.g., compliant pins) or soldered to the printed circuit board substrate 132.

Figure 6:
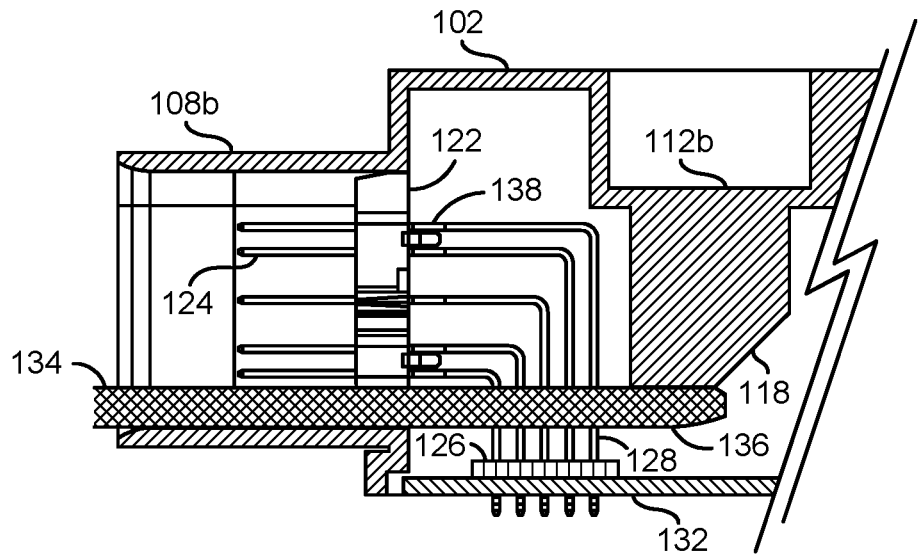
FIG. 6 is a diagram of a cross-sectional view illustrating the terminal pin assembly and a comb tool inserted in the housing in accordance with an example embodiment of the invention.

Referring to FIG. 6, a diagram of a cross-sectional view is shown illustrating the terminal pin assembly and an assembly fixture in accordance with an example embodiment of the invention. When the terminal pin assembly 120 has been fully inserted into the upper housing 102, the printed circuit board substrate 132 may be installed. However, a large force is needed to insert compliant terminals pins 124 into holes or vias of the printed circuit board substrate 132. To prevent the terminal pins 124 from being bent, an assembly fixture may be used to support the insertion force.

In various embodiments, the assembly fixture comprises a comb-like tool 134. In an example, the comb-like tool 134 comprises a plurality of beams (or fingers) 136 that support the shoulders 128 of the terminal pins 124 during installation of the printed circuit board substrate 130. The comb-like tool (or multiple comb-like tools) 134 is(are) inserted into the upper housing 102 through the connector openings 106*a* and 106*b* and connector shrouds 108*a* and 108*b* of the upper housing 102. The comb-like tool (or multiple comb-like tools) 134 slide(s) under a first end of the terminal pins 124, through the window or gap 130 adjacent to the terminal carrier 122, and into the housing 102. As the comb-like tool 134 protrudes into the housing 102, the beams 136 slide between the terminal pins 124. Ends of the beams 136 generally contain chamfers and radii to accommodate alignment variation of the terminal pins 124. When the comb-like tool 134 has been inserted completely, a first side of the beams 136 are vertically adjacent to the ribs 118*a* of the comb support feature 118 in the upper housing 102 and a second (opposite) side of the beams 136 are adjacent to the terminal shoulders 128. Each beam 136 generally supports one shoulder 128 from each terminal pin 124 in adjacent rows, so each terminal pin 124 is supported by two beams 136. During the insertion of the terminal pins 124 into the printed circuit board substrate 132, the press fit force is transferred to the terminal pins 124, which are supported by the beams 136. The ribs 118*a* of the comb support feature 118 generally help absorb some of the load from the beams 136 and prevent a bending moment, which reduces deflection and stress in the beams 136. In some embodiments, the comb-like tool 134 may contain multiple rows of beams 136 that may go between individual rows of terminal pins 124 and align with additional terminal pin shoulders 128.

Figure 7:
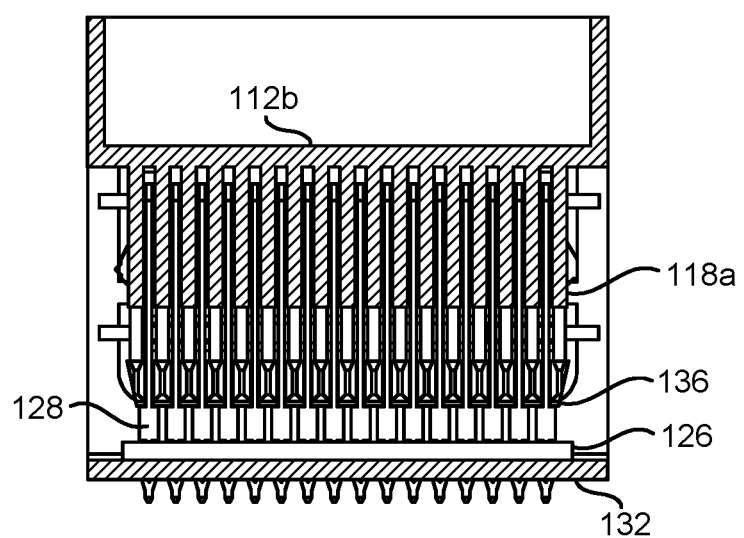
FIG. 7 is a diagram of another cross-sectional view illustrating the terminal pin assembly and fingers of the comb tool in relation to the integral comb support feature of the housing in accordance with an example embodiment of the invention.

Referring to FIG. 7, a diagram of another cross-sectional view is shown illustrating the terminal pin assembly and assembly fixture in relation to the integral comb support feature of the housing in accordance with an example embodiment of the invention. When the comb-like tool 134 has been inserted completely, a first side of the beams 136 are vertically adjacent to the terminal shoulders 128 and a second (opposite) side of the beams 136 are adjacent to the ribs 118*a* of the comb support feature 118 in the upper housing 102. Each beam 136 generally supports one shoulder 128 from each terminal pin 124 in adjacent rows, so each terminal pin 124 is supported by two beams 136. During the insertion of the terminal pins 124 into the printed circuit board substrate 132, the press fit force is transferred to the terminal pins 124, which are supported by the beams 136. In some embodiments, the comb-like tool 134 may contain multiple rows of beams 136 that may go between individual rows of terminal pins 124 and align with additional terminal pin shoulders 128. The ribs 118*a* of the comb support feature 118 generally help absorb some of the load from the beams 136 and prevent a bending moment, which reduces deflection and stress in the beams 136. The ribs 118*a* of the comb support feature 118 may also be utilized to transfer some of the load from the beams 136 to an assembly fixture or tool (not shown) inserted into the indentation 112*b* and configured to provide back support for the comb support feature 118 within the upper housing 102. The use of an assembly fixture (not shown) to hold the upper housing and to provide back support to the comb support feature 118 generally allows a lighter (less expensive) material to be used for the housing 102. The load of the press fit force is generally supported on one end by the housing support ribs 118*a* and the other end by the bottom of the terminal carrier 122 to avoid a large bending moment. The housing 102 may also be supported by the assembly fixture (not shown) being in contact with the surfaces 102*a* and/or 108*b* to receive the load acting on the terminal carrier and keep the housing 102 balanced in the assembly fixture.

Figure 8:
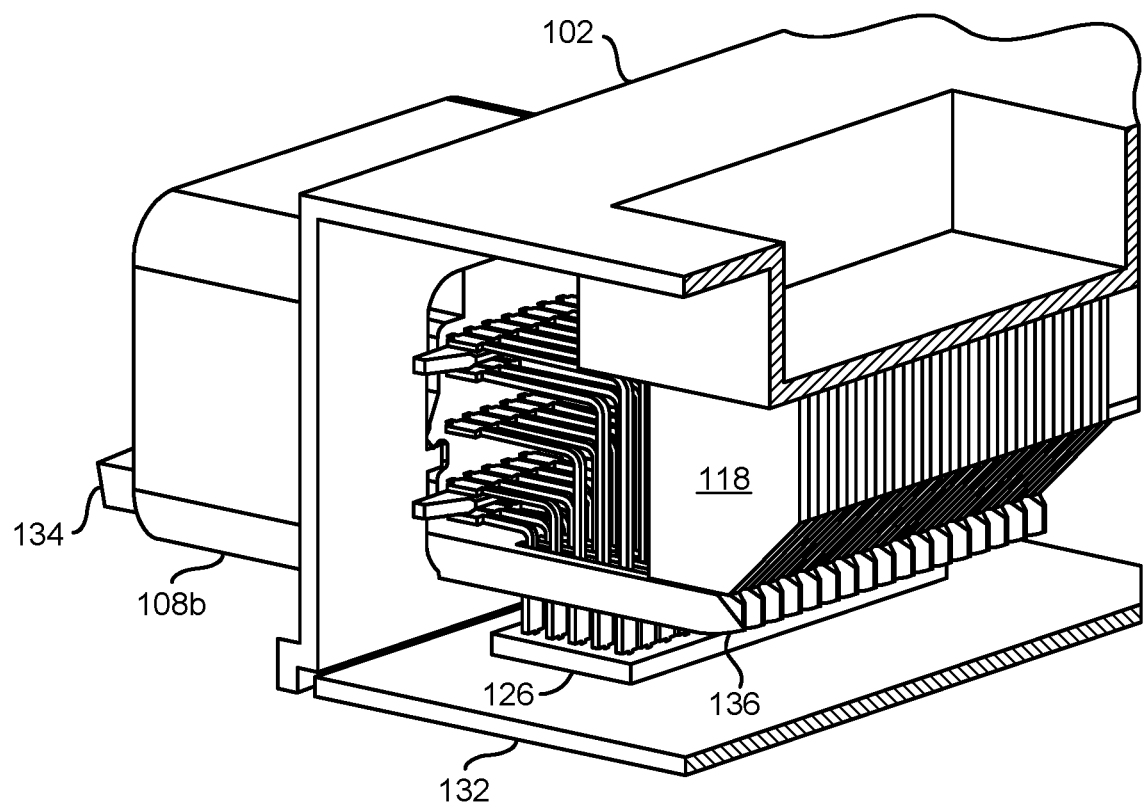
FIG. 8 is a diagram of a perspective view illustrating the terminal pin assembly, the comb tool, and the integral comb support feature in the housing in accordance with an example embodiment of the invention.

Referring to FIG. 8, a diagram of a perspective view is shown illustrating an example interaction between the terminal pin assembly, the comb-like assembly fixture, and the integral comb support feature in the housing in accordance with an example embodiment of the invention. In general, comb support feature 118 and the terminal carrier 122 cooperate to provide a robust support to allow the comb-like tool 134 to counteract the press fit force transferred to the terminal pins 124 during the insertion of the terminal pins 124 into the printed circuit board substrate 132. The force provided by the beams 136 of the comb-like tool 134 generally prevents the terminal pins 124 from being damage or deflected by the press fit force. By preventing the terminal pins 124 from being deflected, the support provided by the comb support feature 118, the terminal carrier 122, and the beams 136 ensure the compliant terminals of the terminal pins 124 are fully inserted in the printed circuit board substrate, providing improved reliability of the final assembly.

Figure 9:
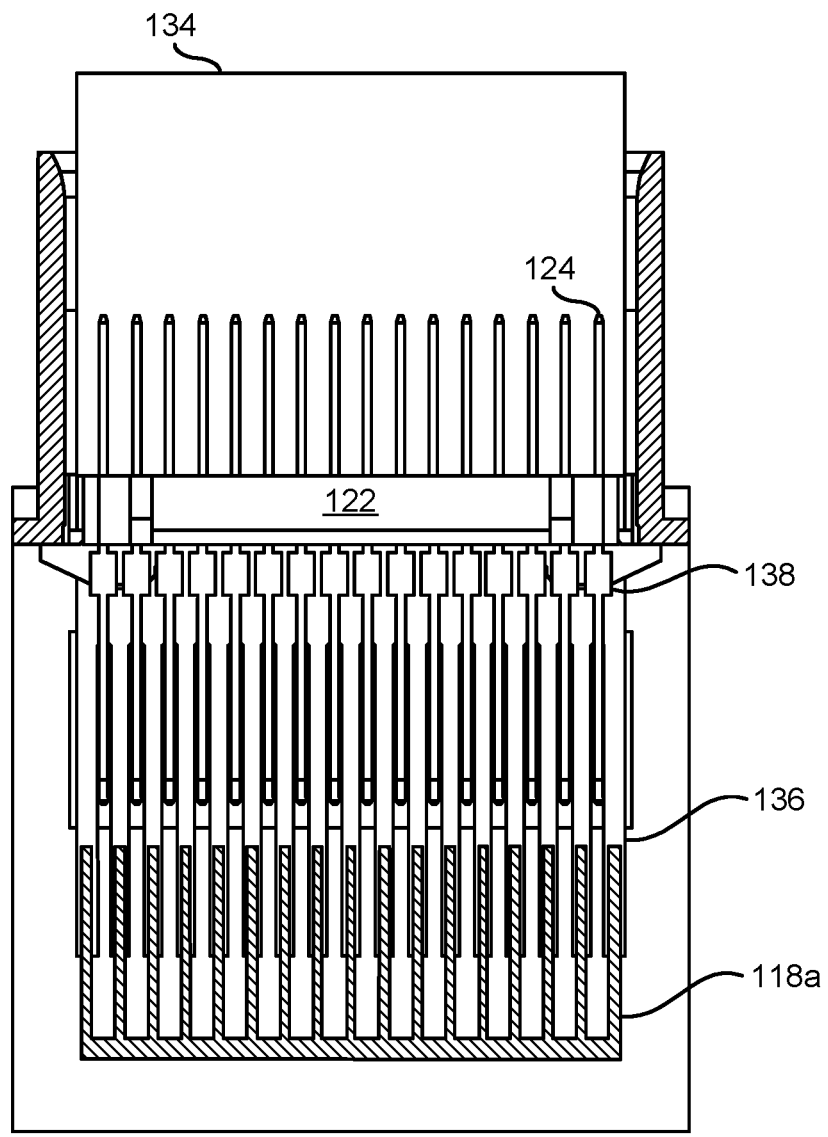
FIG. 9 is a diagram of a plan view illustrating the terminal pin assembly, the comb tool, and the integral comb support feature in the housing in accordance with an example embodiment of the invention.

Referring to FIG. 9, a diagram of a plan view is shown illustrating vertical alignment of the terminal pin assembly, the assembly fixture, and the integral comb support feature in the housing in accordance with an example embodiment of the invention. In various embodiments, the ribs 118*a* of the comb support feature 118 overlap a significant portion of the respective beams 136 of the comb-like tool 134. The overlap generally ensures that the ribs 118a of the comb support feature 118 generally help absorb some of the load from the beams 136 and prevent the bending moment, which reduces deflection and stress in the beams 136.

Figure 10:
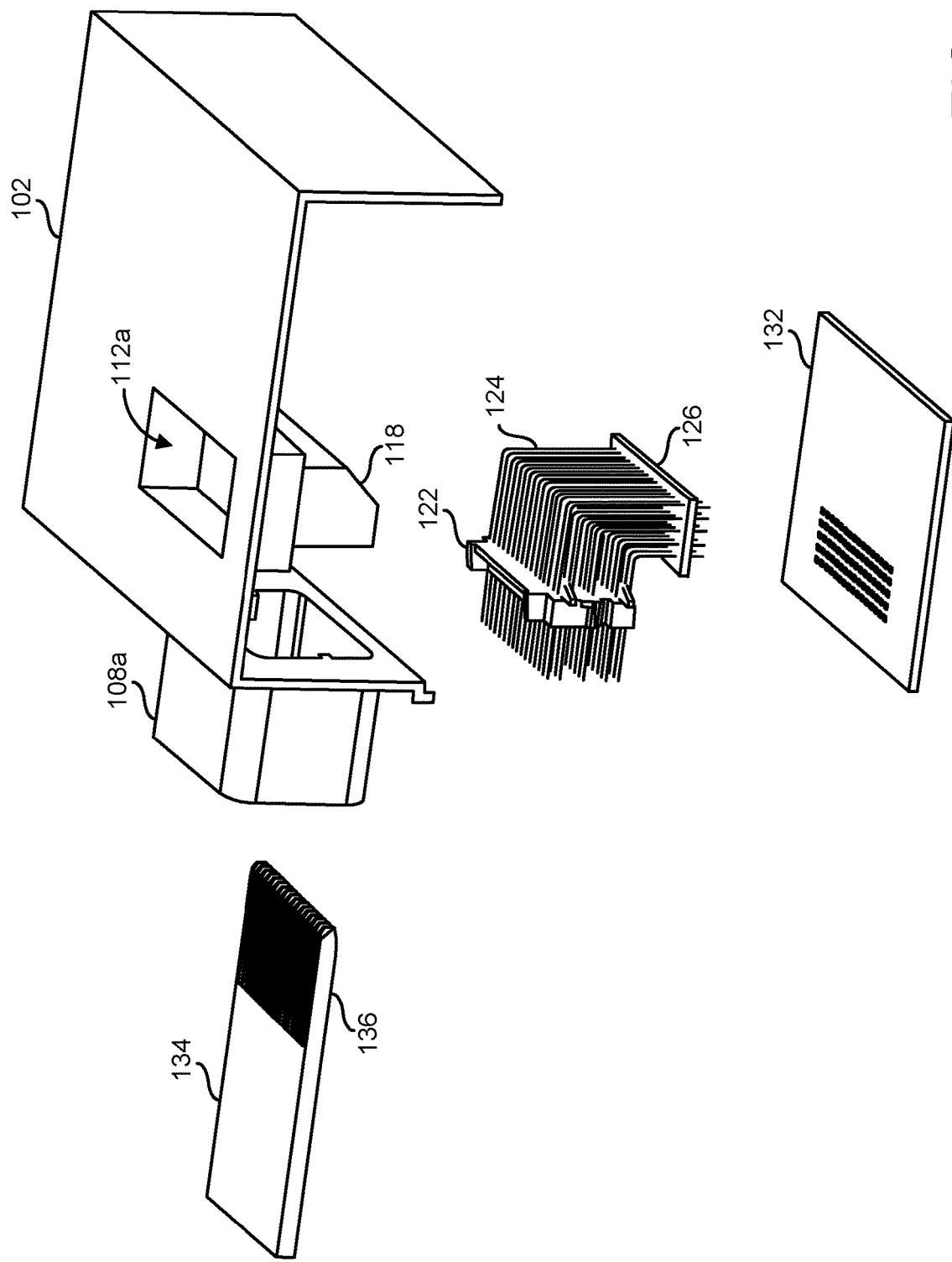
FIG. 10 is a diagram of an exploded view illustrating the terminal pin assembly, the comb tool, and a printed circuit board substrate prior to insertion into the housing with the integral comb support feature in accordance with an example embodiment of the invention.

Referring to FIG. 10, a diagram of an exploded view is shown illustrating a process for assembling the terminal pin assembly, the assembly fixture, and a printed circuit board substrate prior to insertion into the housing with the integral comb support feature in accordance with an example embodiment of the invention. In a first step, the pre-assembled terminal pin assembly 120 may be inserted into the housing 102 and shifted (translated) into a respective connector shroud 108a and 108b through a respective connector opening 106a or 106b. In an example, the number of locating features 129a-129n may ensure vertical and horizontal alignment of the terminal carrier 122 within the respective connector opening 106a and 106b. In an example, the terminal carrier 122 may also be constrained to the respective connector shrouds 108a and 108b by snap features, heat or cold staking, any type of welding, use of adhesive, or screws.

In a second step, a portion or the entirety of the comb-like tool 134 may be inserted into the housing 102. In some embodiments, an assembly fixture may be inserted into the indentation 112a prior to insertion of the comb-like tool 134. The comb-like tool 134 is generally inserted into the upper housing 102 through the connector shrouds 108a and 108b of the upper housing 102. The comb-like tool (or multiple comb-like tools) 134 is slid under the terminal pins 124, through the window or gap 130 adjacent to the terminal carrier 122, and into the housing 102. The comb-like tool 134 is generally inserted into the housing 102 until the comb-like tool 134 has been inserted completely (e.g., a first side of the beams 136 are vertically adjacent to the ribs 118a of the comb support feature 118 in the upper housing 102 and a second (opposite) side of the beams 136 are adjacent to the terminal shoulders 128.

In a third step, the printed circuit board substrate 132 may be aligned with the opening 114 in the housing 102 and vias (or plated holes) in the printed circuit board substrate 132 may be aligned with the ends of the terminal pins 124. The printed circuit board substrate 132 may be moved toward the housing 102 and the terminal pin assembly 120 to insert the terminal pins 124 in the vias of the printed circuit board substrate 132. During the insertion of the terminal pins 124 into the vias of the printed circuit board substrate 132, the press fit force may be transferred via the terminal pins 124 to the beams 136 of the comb-like tool 134, and from the beams 136 of the comb-like tool 134 to the ribs 118a of the comb support feature 118. In embodiments having an assembly fixture inserted in the indentation 112a, the ribs 118a of the comb support feature 118 may then transfer the press fit force to the assembly fixture inserted in the indentation 112a.

In a fourth step, the comb-like tool 134 may be withdrawn from the housing 102 and the opening 114 into the upper housing 102 may be closed by assembly of the lower housing 104 to the upper housing 102. In some embodiments, the opening 114 may be closed and/or sealed prior to the comb-like tool 134 be removed. In various embodiments, the opening 114 may be closed by fastening the lower housing 104 to the upper housing assembly 102 via screws, snaps, heat staking, etc. In embodiments where the upper housing 102 includes geometry (e.g., groove, etc.) 116, a gasket, a dispensed type sealant, an adhesive sealant, or welded cover may be applied to the housing 102 to seal the interface between the upper housing 102 and the lower housing 104.

Figure 11:
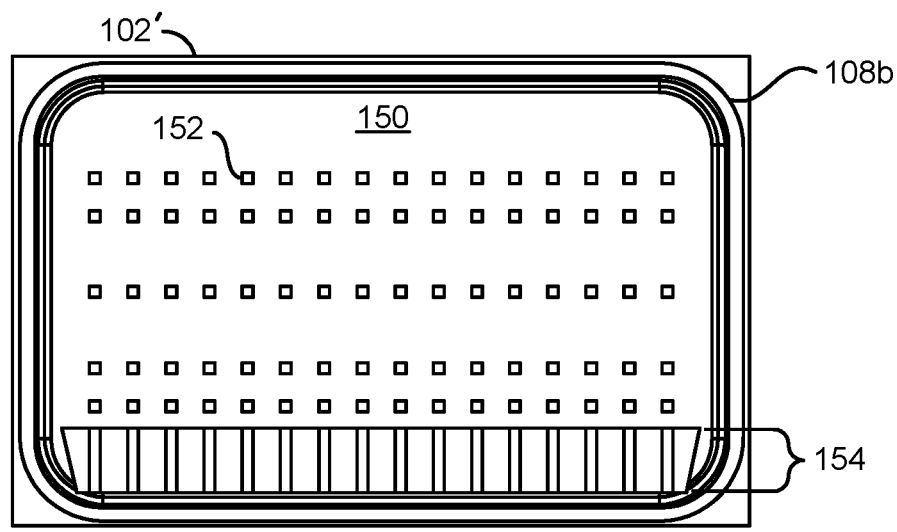
FIG. 11 is a diagram of a cross-sectional view illustrating an example housing having an integral terminal carrier and an integral comb support feature in accordance with another example embodiment of the invention.
Figure 11:
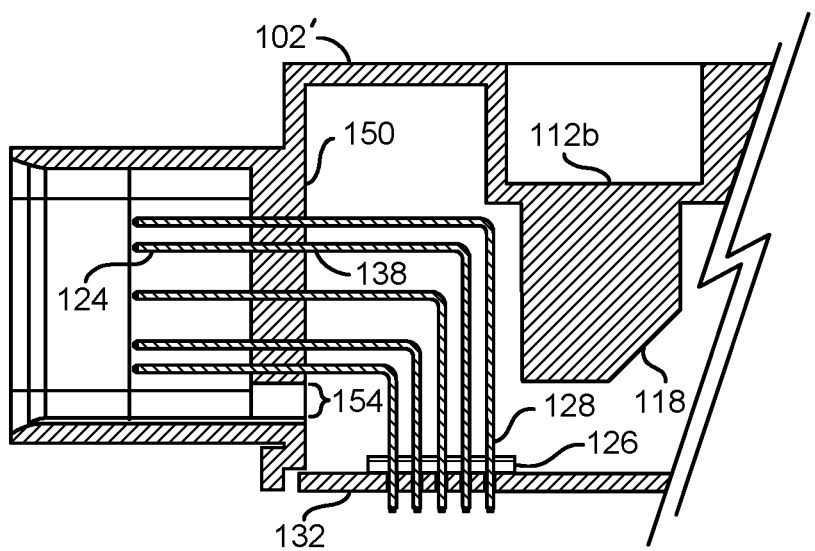
Figure 11:
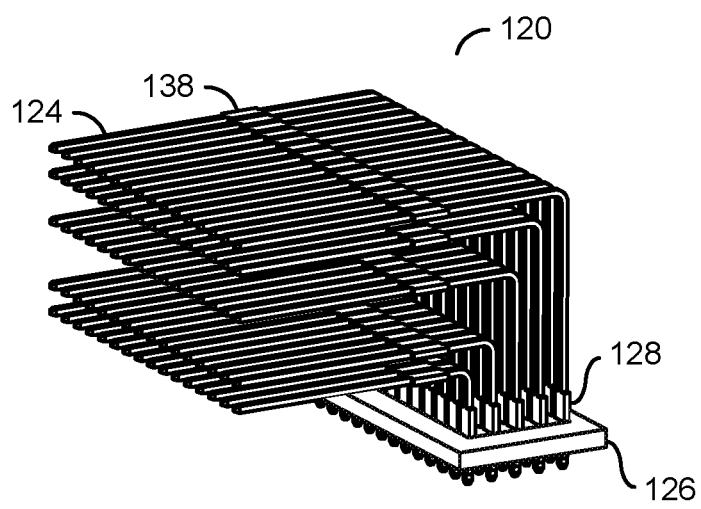

Referring to FIG. 11, a diagram of a cross-sectional view is shown illustrating an example housing having an integral terminal carrier and an integral comb support feature in accordance with another example embodiment of the invention. In some embodiments, an upper housing 102' may be implemented in place of the upper housing 102. The upper housing 102' may be implemented similarly to the upper housing 102, except that the upper housing 102' may further comprise an integral terminal carriers 150 filling portions of the connector openings 106a and 106b. In an example, the upper housing 102' and the integral terminal carrier 150 may be molded (made) as a single (unitary) piece.

In an example, the integral terminal carrier 150 may comprise a number of small holes 152. The terminal pins 124 may be stitched into the holes 152. In an example, the terminal pins 124 may comprise barbs configured to lock the terminal pins into the integral terminal carrier 150. The terminal pins 124 may also comprise shoulders 138 which limit the depth to which the terminal pins 124 are inserted in the integral terminal carrier 150. In an example, the terminal pins 124 may be bent to a right angle, then stitched into the holes 152. A circuit board end of each of the terminal pins 124 may also be inserted into a pin alignment plate (or film) 126 to control the positions of the respective terminal pins 124. The pin alignment plate (or film) 126 may be configured to ensure that every terminal pin 124 is able to be inserted into a respective mating hole in the printed circuit board substrate 126.

In various embodiments, the integral terminal carrier 150 leaves a gap 154 trough which the comb-like tool 134 may be inserted. The comb-like tool 134 may be inserted into the upper housing 102' through the connector shrouds 108a and 108b of the upper housing 102'. The comb-like tool (or multiple comb-like tools) 134 may be slid under the terminal pins 124, through the window or gap 154 adjacent to the integral terminal carrier 150, and into the housing 102'. The comb-like tool 134 is generally inserted into the housing 102' until the comb-like tool 134 has been inserted completely (e.g., a first side of the beams 136 are vertically adjacent to the terminal shoulders 128 and a second (opposite) side of the beams 136 are adjacent to the ribs 118a of the comb support feature 118 in the upper housing 102'.

Figure 12:
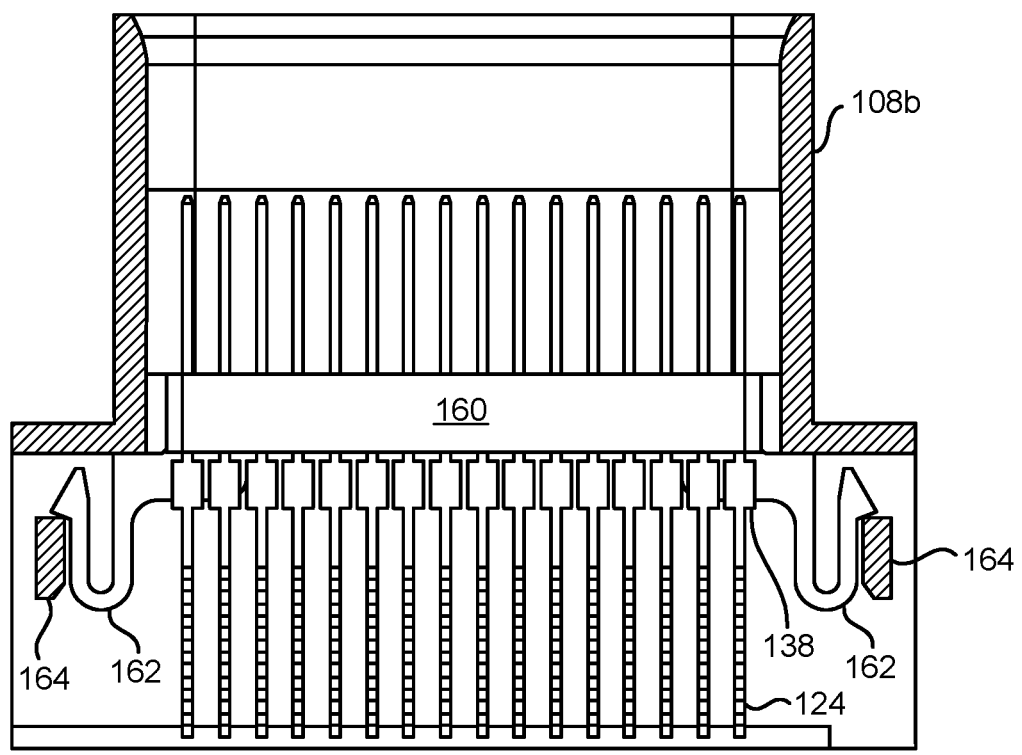
FIG. 12 is a diagram of a cross-sectional view illustrating an example of a terminal carrier comprising a snap feature inserted into a housing in accordance with another example embodiment of the invention.

Referring to FIG. 12, a diagram of a cross-sectional view is shown illustrating an example of a terminal carrier comprising a snap fit feature inserted into a housing in accordance with another example embodiment of the invention. In some embodiments, a terminal pin assembly may be manufactured with a terminal carrier 160. In an example, the terminal carrier 150 may be implemented similarly to the terminal carrier 150, except that the terminal carrier 160 may comprise snap fit (or interlock) features 162 in place of or in addition to the alignment features 129a-129n. In embodiments implementing the terminal carrier 160, the housing 102 may include interlocking snap fit features 164 that engage the snap fit features 162 of the terminal carrier 160 when the terminal carrier 160 is slid into position in the respective connector shroud 108a and 108b.

Figure 13:
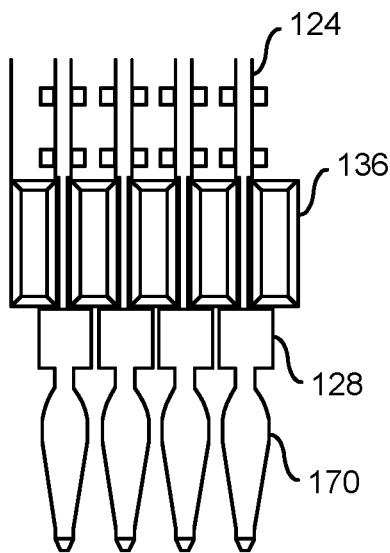
FIG. 13 is a diagram illustrating interaction between a comb tool and pin shoulders of the terminal pins in a terminal pin assembly inserted into a housing in accordance with an example embodiment of the invention.

Referring to FIG. 13, a diagram is shown illustrating an example interaction between beams 136 of the comb-like tool 134 and pin shoulders of the terminal pins in a terminal pin assembly inserted into a housing in accordance with an example embodiment of the invention. As the comb-like tool 134 protrudes into the housing 102, the beams 136 slide between the terminal pins 124. The ends of the beams 136 generally contain chamfers and radii to accommodate alignment variations of the terminal pins 124. When the comb-like tool 134 has been inserted completely, a first side of the beams 136 are adjacent to (in contact with) the terminal shoulders 128 of the terminal pins 124. Each beam 136 generally supports one shoulder 128 from each terminal pin 124 in adjacent rows, so each terminal pin 124 is supported by two beams 136. During the insertion of the terminal pins 124 into the printed circuit board substrate 132, the beams 136 counteract the press fit force transferred to the terminal pins 124.

Figure 14:
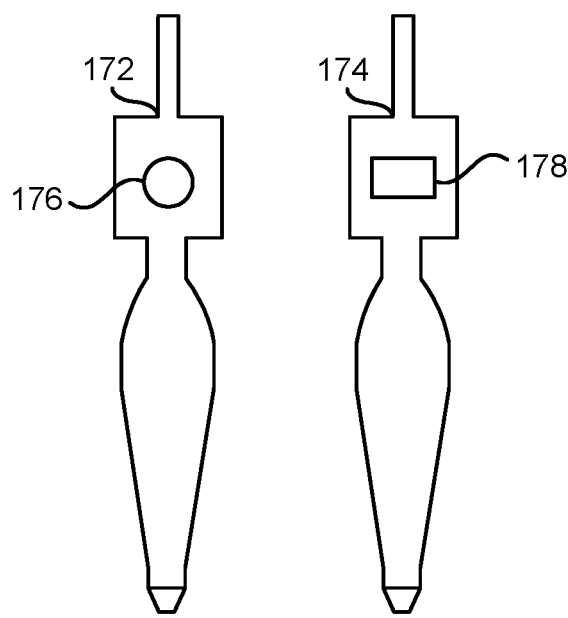
FIG. 14 is a diagram illustrating variations in pin shoulders of terminal pins in accordance with example embodiments of the invention.

Referring to FIG. 14, a diagram is shown illustrating variations in terminal pin shoulders in accordance with example embodiments of the invention. In various embodiments, the terminal pins 124 may comprise apertures (or slots or holes) in the shoulders 128. In an example, a second end 172 of a terminal pin 124 may have a round aperture 176. In another example, a second end 174 of a terminal pin 124 may have a rectangular aperture 178. Other shapes and numbers of apertures (or slots or holes) may be implemented to meet design criteria of a particular implementation. In an example, the beams 136 may have a cross-section allowing the beams 136 to engage (e.g., go through) the holes in the shoulders of the terminal pins 124 to support the insertion force of the printed circuit board substrate 132.

Figure 15:
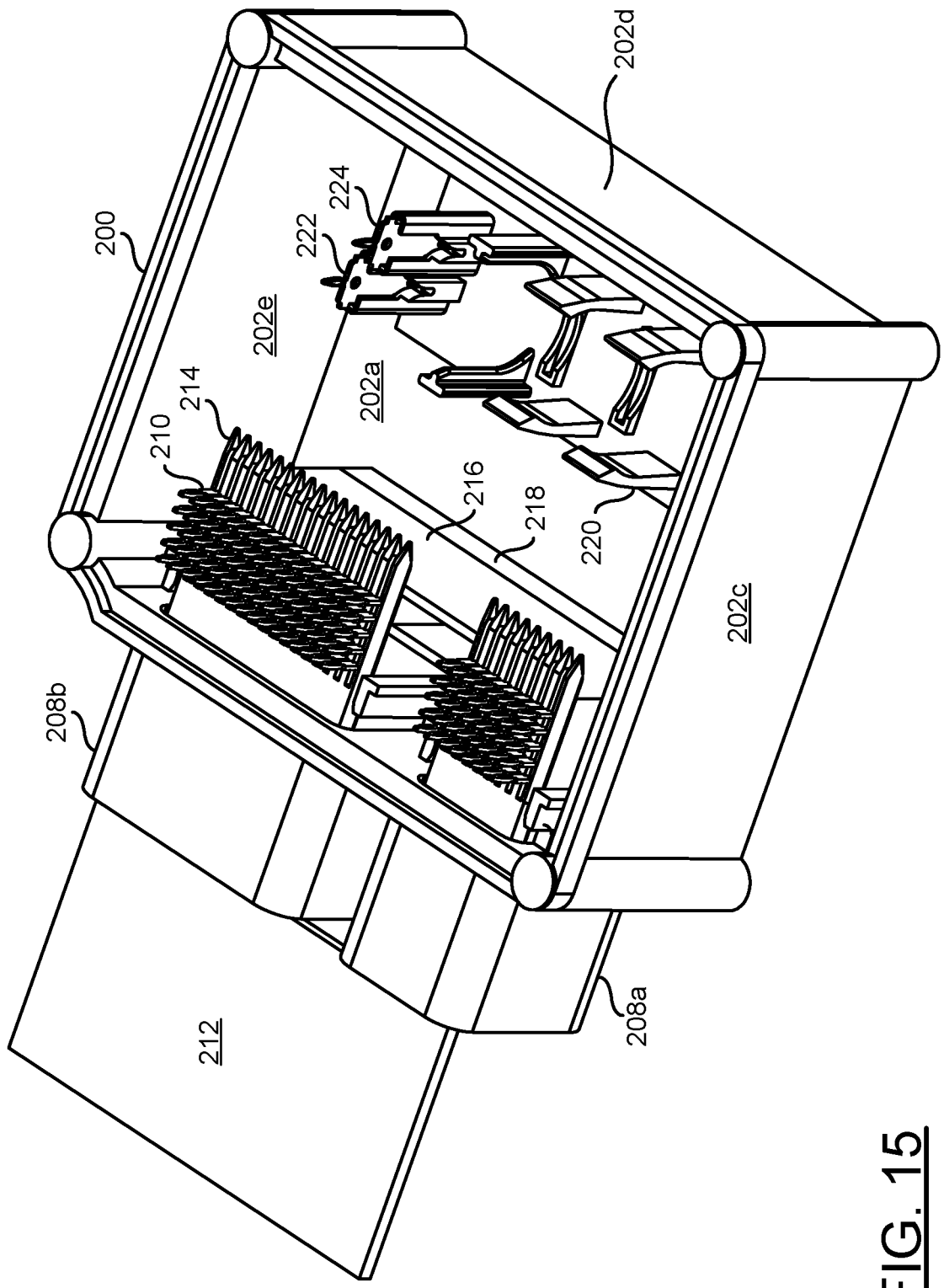
FIG. 15 is a diagram illustrating an upper portion of a housing with a separate comb tool support block feature in accordance with another example embodiment of the invention.

Referring to FIG. 15, a diagram is shown illustrating an upper housing 200 comprising a separate comb tool support block feature in accordance with another example embodiment of the invention. In various embodiments, the housing (or enclosure) 200 may be part of an electronic control unit (or module). In an example, the electronic control unit (ECU) may be configured for application in a motor vehicle. In various embodiments, the upper housing (or enclosure) 200 while mated with the lower housing (not shown) may be configured to provide an environmentally sealed enclosure. The enclosure 200 may protect components and devices of a subassembly enclosed within.

In various embodiments, the upper housing 200 may be implemented as a non-conductive enclosure. In various embodiments, the upper housing 200 generally comprises a plastic or resin based material. In various embodiments, the plastic material may include, but is not limited to, polyamide (NYLON), polybutylene terephthalate (PBT), polypropylene, polyethylene terephthalate (PET), acrylonitrile butadiene styrene (ABS), and/or various alloys and/or fillers of these resins. Other materials may be implemented to meet the design criteria of a particular application.

In various embodiments, the upper housing 200 generally includes five sides 202a-202e. In an example, the side 202a may be referred to as a top of the upper housing 200 and the sides 202b-202e may extend approximately perpendicularly from the side 202a. The terms upper and top are used for convenience of description and not as an indication a particular orientation of the electronic control module housing 200 is required. In various embodiments, one of the sides (e.g., 202b) of the upper housing 200 may include two connector openings. The two connector openings may be surrounded by respective connector shrouds 208a and 208b that may be integrated into the upper housing 200. However, other numbers (e.g., 1-n) of connector openings and connector shrouds (e.g., 208a-208n) may be implemented to meet design criteria of a particular implementation. The connector shrouds 208a and 208b are generally integrated into the upper housing 200. In an example, the upper housing 200 and the connector shrouds 208a and 208b may be molded (made) as a single (unitary) piece. Molding or otherwise incorporating the connector shrouds 208a and 208b as part of the upper housing (enclosure) 200 generally eliminates a need for sealing the connector/housing interface(s).

In various embodiments, the upper housing 200 generally includes an integral connector sealing feature to reduce or eliminate potential leak paths. In an example, inner surfaces of the connector shrouds 208a and 208b, respectively, may be configured to seal the connector shrouds 208a and 208b to mating connectors (not shown) so the connector openings within the connector shrouds 208a and 208b do not present a potential leakage path into an interior of the housing 200. In an example, the mating connectors (not shown) may comprise an O-ring or some other type of gasket or seal configured to seal against the inner surfaces of the connector shrouds 208a and 208b.

In an example, the lower housing (or cover or baseplate) may be implemented as a die-cast aluminum baseplate. In another example, the lower housing (or cover or baseplate) may be implemented as a stamped steel baseplate. Implementing the lower housing with a metallic material may aid in dissipating heat generated by circuitry within the sealed enclosure 200. In various embodiments, the lower housing may be machined to create a sealing surface against which a gasket placed between the upper housing 200 and the lower housing may form a seal when the upper housing 200 and the lower housing are fastened together.

In an example, the connector shroud 208a may be configured to accept a 52-pin connector and the connector shroud 208b may be configured to accept a 104-pin connector. The 52 and 104 pin connectors may be configured to provide electrical connections to a circuit board enclosed within the enclosure 200. In an example, the connectors may be implemented as 1.8 mm pitch Nano connectors. However, other types and sizes of connectors may be implemented to meet the design criteria of a particular implementation.

The five sides 202a-202e of the upper housing 200 generally define an interior space (e.g., rectilinear volume) within the housing 200. The five sides 202a-202e generally leave an opening through which a pre-assembled terminal pin assembly 210, a separate comb support block 216, and a printed circuit board substrate 236 may be inserted during respective assembly steps. In an example, the pre-assembled terminal pin assembly 210 is generally inserted into the upper housing 200 such that terminal pins of the terminal pin assembly extend into the connector shrouds 208a and 208b. The separate comb tool support block 216 is generally configured to be inserted in the housing 200 to allow the a comb tool 212 to support a press fit force on the terminal pins of the terminal pin assembly 210 during insertion of the terminal pins into plated holes (or vias) of the printed circuit board substrate 236. The separate comb tool support block 216 generally fits over a right angle bend in the terminal pins of the terminal pin assembly 210. By making the comb support block 216 as a separate component, the comb support block 216 may be aligned directly under shoulders of the terminal pins of the terminal pin assembly 210, which eliminates the bending moment on the comb tool 212 when the printed circuit board substrate is assembled to the terminal pins. Due to the rigidity of the comb tool 212, the load transferred from the terminal shoulders is generally distributed evenly across the area of the comb support block 216 upon which the comb tool 212 rests. Distributing the load evenly across the support area of the comb support block 216 keeps stress on the material of the comb support block 216 at a safe level.

In some embodiments, the upper housing 200 may further comprise an indentation 218 similar to the indentations 112a and 112b described above. The indentation 218 may be located in a surface (e.g., 202a) below (or adjacent to) the comb support block 216. The indentation 218 is generally positioned to correspond (align) with the connector openings the connector shrouds 208a and 208b. The indentation 218 is generally configured to allow a tool (or tools) to be inserted against an external surface (e.g., surface 230 in FIG. 16) to provide back support for the comb support block 216 within the upper housing 200. In an example, the indentation 218 generally reduces an amount of material (and, therefore, weight) in the upper housing 200, while still facilitating use of an assembly fixture to provide support to the comb support block 216 within the upper housing 200.

In some embodiments, the upper housing 200 may also contain a component mounting feature 220 comprising insulation displacement connectors (IDCs) 222 and 224. The IDCs 222 and 224 may be configured to electrically connect a component (e.g., a capacitor) mounted within the component mounting feature 220 to the printed circuit board substrate 236. In designs where the upper housing 200 holds a capacitor and the insulation displacement contacts 222 and 224, the insulation displacement contacts 222 and 224 are generally pressed onto the capacitor leads. The IDCs 222 and 224 may comprise compliant pins that may be inserted (or press fit) into plated holes (or vias) on the printed circuit board substrate 236. Compliant pins generally need some insertion (or press fit) force in order to be assembled to plated holes in a printed circuit board (PCB). The upper housing 200 may be configured to support the press fit force of the compliant pin portion of the IDCs 222 and 224 being assembled to the printed circuit board substrate 236.

Figure 16:
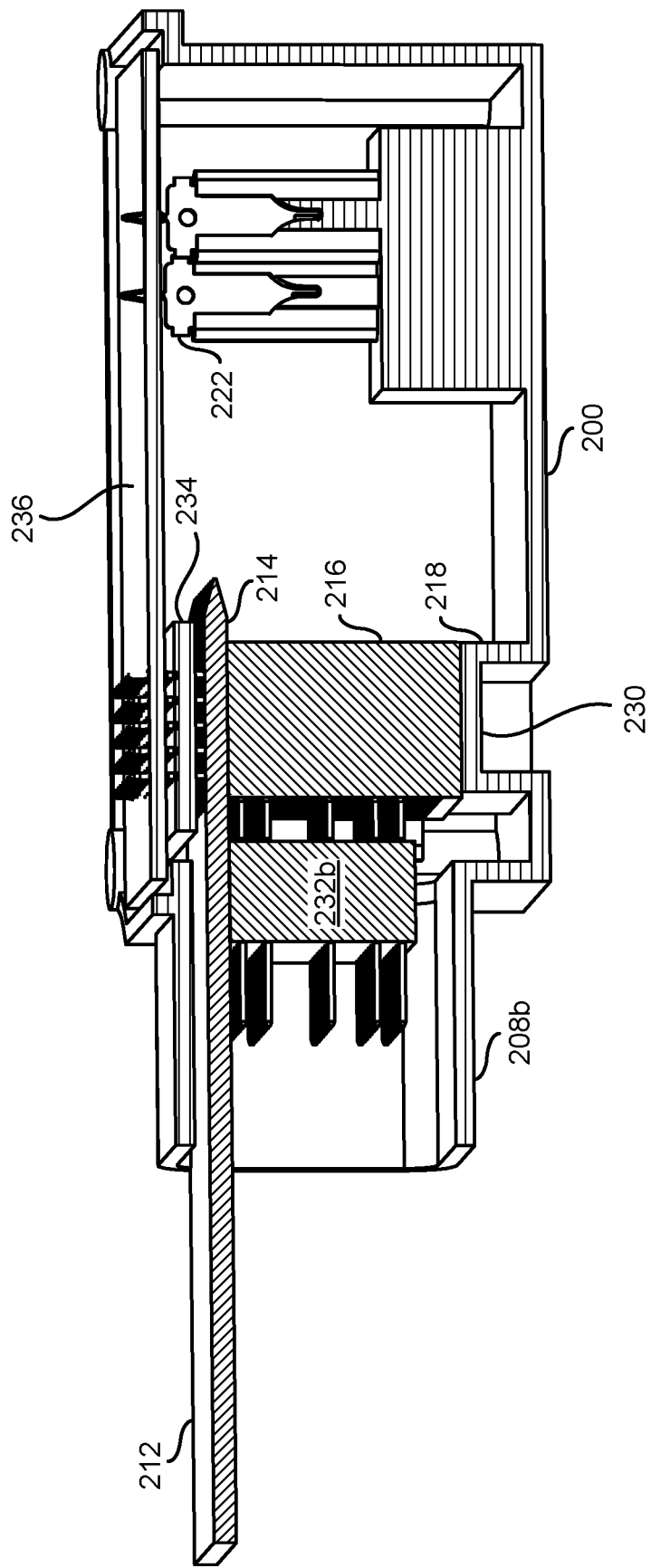
FIG. 16 is a diagram of a cross-sectional view illustrating a terminal pin assembly and a comb tool inserted in the housing with the separate comb support block feature during an assembly process in accordance with an example embodiment of the invention.

Referring to FIG. 16, a diagram of a cross-sectional view is shown illustrating a terminal pin assembly and a comb tool inserted in the housing with the separate comb support block feature during an assembly process in accordance with an example embodiment of the invention. In various embodiments, a portion of the terminal pin assembly 210 within the connector shroud 208b may comprise a terminal carrier (or header or keeper) 232b. The terminal carrier 232b is generally used to maintain a dimensional relationship between the terminal pins within the connector shroud 208b. The terminal carrier 232b also supports the terminal pins within the connector shroud 208b. A terminal carrier 232a similar to the terminal carrier 232b may be located with the connector shroud 208a. In an example, the terminal pins may be stitched into the terminal carrier 232b, which retains and controls the position of the terminal pins. After the terminal pins are stitched into the terminal carrier 232b, the terminal pins may be bent to a right angle.

In various embodiments, the terminal carrier 232b may be configured to fit through a respective connector opening and within a respective connector shroud 208b. In an example, the terminal carrier 232b may comprise a number of locating features (e.g., similar to the locating features 129a-129n described above) for vertical and horizontal alignment. In some embodiments, the terminal carrier 232b may also comprise tabs or a flange that stops on an inside surface of the housing 200 to control a maximum insertion distance. In an example, the terminal carrier 232b may also be constrained to the connector shroud 208b by snap features, heat or cold staking, any type of welding, use of adhesive, or screws. In various embodiments, the terminal carrier 232b is smaller in height than the inside of the connector shroud 208b to leave a gap through which the com-like tool 212 may pass.

In some embodiments, the terminal pin assembly may also comprise a pin alignment plate (or alignment film) 234 at a circuit board end of the terminal pins. The pin alignment plate 234 is generally assembled to the terminals pins of the terminal pin assembly 210 abutting a shoulder (not visible) of each terminal pin of the terminal pin assembly 210. An end of each terminal pin of the terminal pin assembly 210 generally extends past the pin alignment plate 234 for insertion into the printed circuit board substrate 236. In an example, the circuit board ends of the terminal pins of the terminal pin assembly 210 may be configured for being press fit (e.g., compliant pins) or soldered to the printed circuit board substrate 236.

When the terminal pin assembly 210 has been fully inserted into the upper housing 200, the printed circuit board substrate 236 may be installed. However, a large force is needed to insert compliant terminals pins of the terminal pin assembly 210 into holes or vias of the printed circuit board substrate 236. To prevent the terminal pins of the terminal pin assembly 210 from being bent, the comb support block 216 may be inserted to support an assembly fixture used to support the insertion force. The comb support block 216 is generally inserted between the indentation support feature 218 and shoulders of the terminal pins in the terminal pin assembly 210.

In various embodiments, the comb-like tool 212 comprises a plurality of beams (or fingers) 214 that support the shoulders of the terminal pins during installation of the printed circuit board substrate 236. The comb-like tool (or multiple comb-like tools) 212 is(are) inserted into the upper housing 200 through the connector shrouds 208a and 208b of the upper housing 200. The comb-like tool (or multiple comb-like tools) 212 slide(s) between the terminal pins and internal surfaces of the connector shrouds 208a and 208b, through a window or gap adjacent to the terminal carriers 232a and 232b, and into the housing 200. As the comb-like tool 212 protrudes into the housing 200, the beams 214 slide between the terminal pins of the terminal pin assembly 210. Ends of the beams 214 generally contain chamfers and radii to accommodate alignment variations of the terminal pins. When the comb-like tool 212 has been inserted completely, a first side of the beams 214 are vertically adjacent to the terminal shoulders of the terminal pins in the terminal pin assemblies and a second (opposite) side of the beams 214 are adjacent to the comb support block 216.

Each beam 214 generally supports one shoulder from each terminal pin in adjacent rows, so each terminal pin is supported by two beams 214. During the insertion of the terminal pins into the printed circuit board substrate 236, the press fit force is transferred to the terminal pins, which are supported by the beams 214. The comb support block 216 generally helps absorb some of the load from the beams 214 and prevent a bending moment, which reduces deflection and stress in the beams 214. In some embodiments, the comb-like tool 212 may contain multiple rows of beams 214 that may go between individual rows of terminal pins and align with additional terminal pin shoulders.

Figure 17:
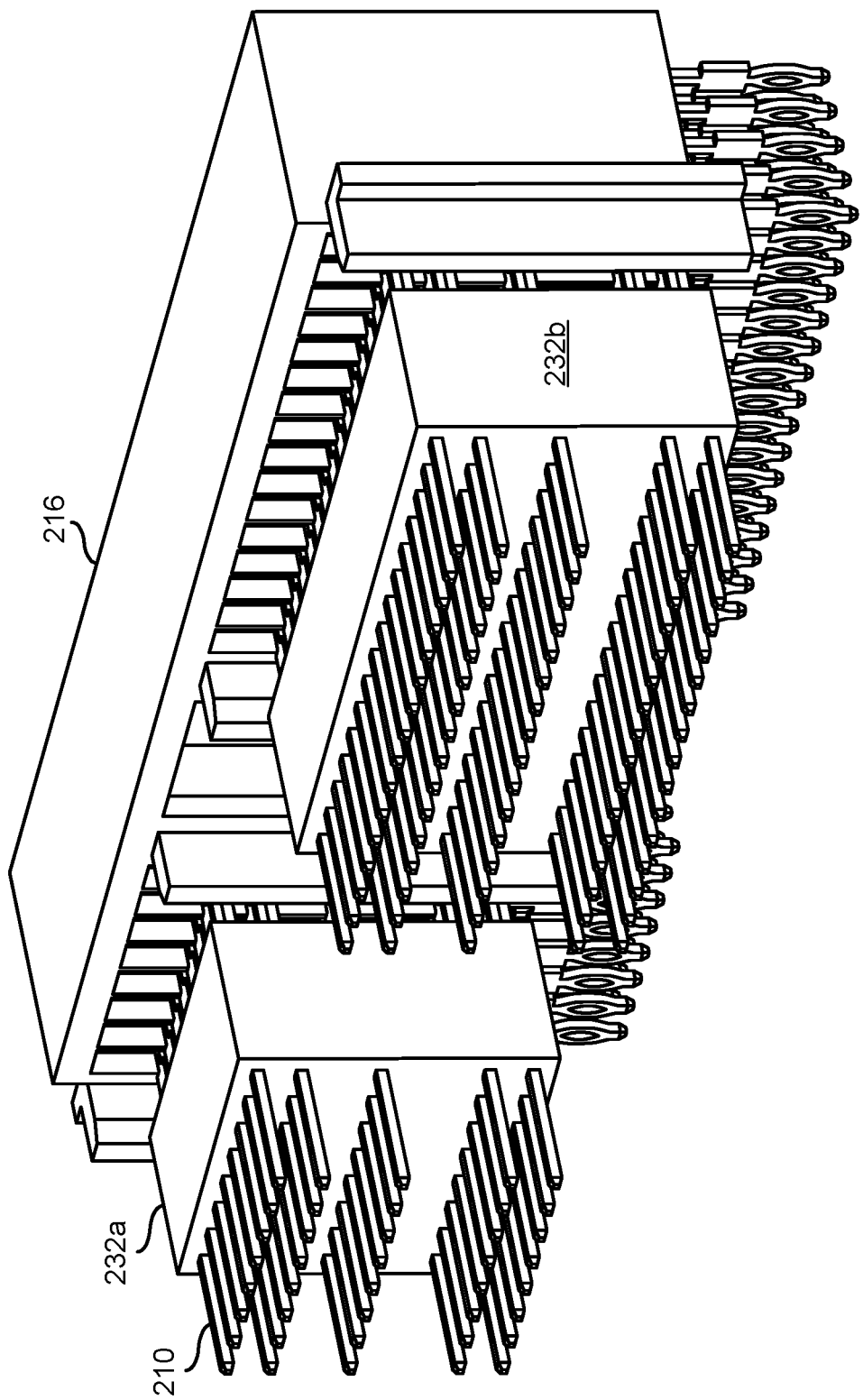
FIG. 17 is a diagram illustrating the terminal pin assembly and separate comb support block feature of FIG. 16.

Referring to FIG. 17, a diagram is shown illustrating the terminal pin assembly and separate comb support block feature of FIG. 16 pre-assembled. In an example, the comb support block 216 may be attached to the terminal pin assembly 210 prior to insertion into the upper housing 200.

Figure 18:
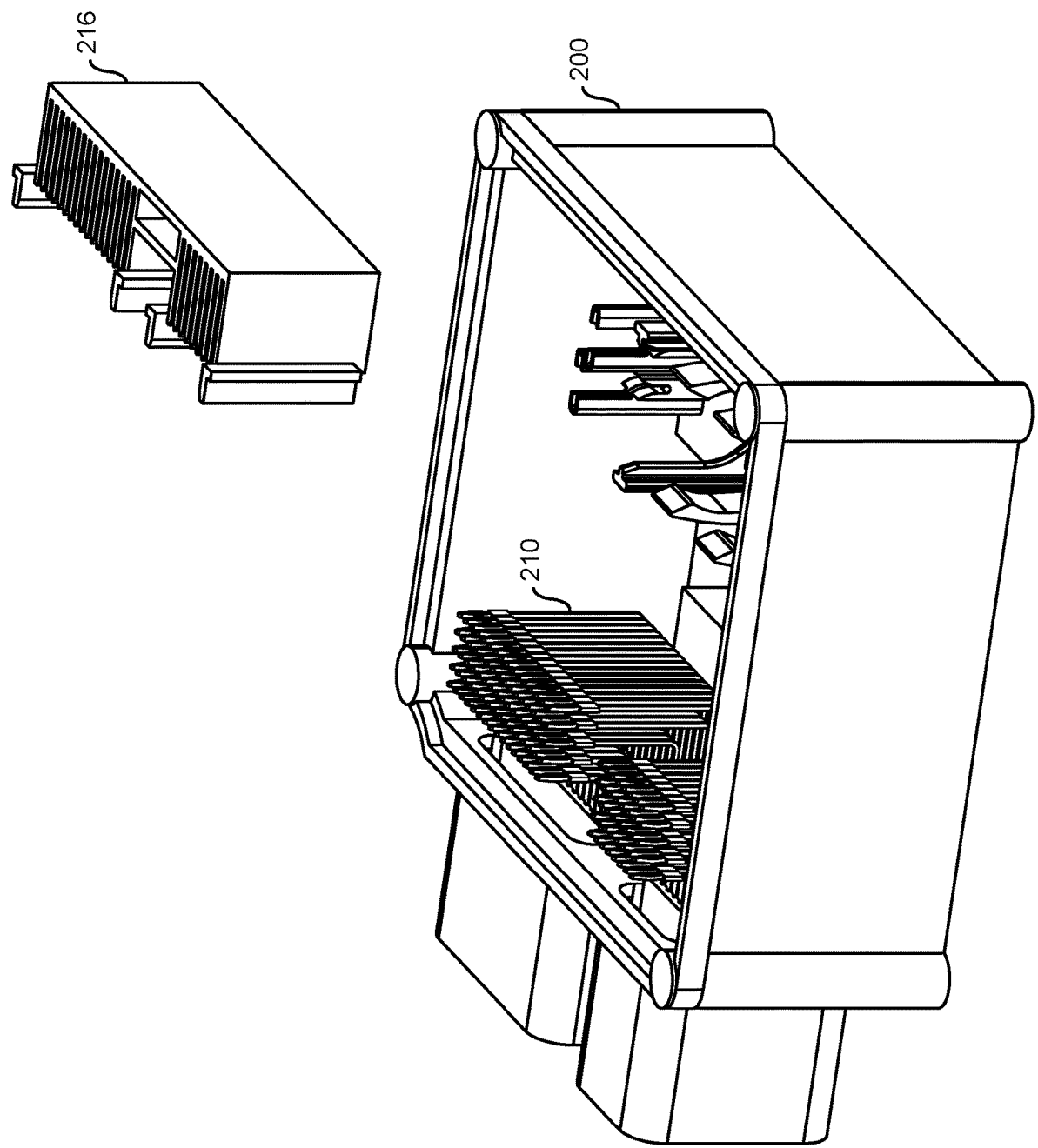
FIG. 18 is a diagram illustrating installation of the separate comb support block feature after installation of the of terminal pin assembly in the housing of FIG. 15.

Referring to FIG. 18, a diagram is shown illustrating installation of the separate comb support block feature after installation of the terminal pin assembly in the housing of FIG. 15. In an example, the comb support block 216 may be attached to the terminal pin assembly 210 after insertion of the terminal pin assembly 210 into the upper housing 200. In an example, the pin alignment plate (or alignment film) 234 may be omitted at the circuit board end of the terminal pins in the terminal pin assembly 210.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. A method of assembling an electronic control unit comprising:
 assembling a terminal carrier holding a plurality of terminal pins into a housing using translational motions, wherein said housing comprises four sides and a comb support feature extending perpendicularly from a fifth side, said sides of said housing define a rectilinear volume, each of said plurality of terminal pins comprises a right angle bend, said comb support feature comprises a plurality of slots into which said right angle bend of said terminal pins fits during a first translational motion placing said terminal carrier and said plurality of terminal pins into said housing, a first end of said plurality of terminal pins is inserted into one or more connector openings in one of said four sides of said housing during a second translational motion, and said terminal carrier interlocks with said housing to hold said terminal carrier and said plurality of terminal pins in place;
 inserting a comb tool through said one or more connector openings until a first side of a plurality of beams of said comb tool are in contact with a plurality of ribs of said comb support feature and a second side of said plurality of beams of said comb tool are in contact with a shoulder of each of said plurality of terminal pins; and
 assembling a printed circuit board substrate to said plurality of terminal pins by inserting a second end of each of said plurality of terminal pins into said printed circuit board substrate using a press fit, wherein said terminal carrier, said comb support feature, said shoulder on each of said plurality of terminal pins, and said comb tool support said plurality of terminal pins to prevent a force of said press fit from bending said plurality of terminal pins.

2. The method according to claim 1, wherein said housing and said comb support feature are formed as a single piece.

3. The method according to claim 1, wherein each of said plurality of slots of said comb support feature admits a row of said terminal pins.

4. The method according to claim 1, wherein each of said plurality of ribs of said comb support feature supports a respective beam of said comb tool.

5. The method according to claim 1, wherein said comb support feature is separate from said housing.

6. The method according to claim 5, wherein said comb support feature is inserted into said housing after inserting said terminal carrier holding said plurality of terminal pins.

7. The method according to claim 5, wherein said comb support feature is assembled to said terminal carrier holding said plurality of terminal pins prior to said terminal carrier being inserted into said housing.

8. The method according to claim 1, wherein said shoulder of each of said plurality of terminal pins comprises an aperture.

9. The method according to claim 8, wherein said beams of said comb tool are further configured to engage said aperture in said shoulder of each of said plurality of terminal pins.

10. An apparatus comprising:
 a housing, wherein said housing comprises five sides defining a rectilinear volume;
 a comb support feature extending perpendicularly from one of said five sides of said housing and comprising a plurality of slots and a plurality of ribs;
 a terminal carrier holding a plurality of terminal pins assembled into said housing, wherein each of said plurality of terminal pins comprises a right angle bend and is aligned with a respective slot of said comb support feature, a first end of said plurality of terminal pins is inserted into one or more connector openings in one of said five sides of said housing and said terminal carrier interlocks with said housing to hold said terminal carrier and said plurality of terminal pins in place; and
 a printed circuit board substrate assembled to said plurality of terminal pins by inserting a second end of each of said plurality of terminal pins into said printed circuit board substrate using a press fit after a comb tool has been inserted through said one or more connector openings until a plurality of beams of said comb tool are placed between said ribs of said comb support feature and a shoulder on a second end of each of said plurality of terminal pins, wherein said terminal carrier, said comb support feature, said shoulder on said second end of each of said plurality of terminal pins, and said comb tool support said plurality of terminal pins to prevent a force of said press fit from bending said plurality of terminal pins.

11. The apparatus according to claim 10, wherein said housing and said comb support feature are formed as a single piece.

12. The apparatus according to claim 10, wherein each of said slots of said comb support feature are aligned with a row of said terminal pins.

13. The apparatus according to claim 10, wherein each of said plurality of ribs of said comb support feature supports a respective beam of said comb tool during said press fit of said printed circuit board substrate to said second end of said terminal pins.

14. The apparatus according to claim 10, wherein said comb support feature is formed as a separate piece from said housing.

15. The apparatus according to claim 10, wherein said shoulder on said second end of each of said plurality of terminal pins comprises an aperture.

16. The apparatus according to claim 15, wherein said beams of said comb tool are further configured to engage said aperture in said shoulder on said second end of each of said plurality of terminal pins.

* * * * *